United States Patent
Ferreol et al.

(10) Patent No.: US 7,336,734 B2
(45) Date of Patent: Feb. 26, 2008

(54) METHOD AND DEVICE FOR THE FOURTH-ORDER, BLIND IDENTIFICATION OF AN UNDER-DETERMINED MIXTURE OF SOURCES

(75) Inventors: Anne Ferreol, Colombes (FR); Laurent Albera, Boulogne Billancourt (FR); Pascal Chevalier, Courbevoie (FR)

(73) Assignee: Thales, Neuilly sur Seine (FR)

( * ) Notice: Subject to any disclaimer, the term of this patent is extended or adjusted under 35 U.S.C. 154(b) by 720 days.

(21) Appl. No.: 10/814,808

(22) Filed: Apr. 1, 2004

(65) Prior Publication Data

US 2004/0247054 A1    Dec. 9, 2004

(30) Foreign Application Priority Data

Apr. 1, 2003    (FR) .................................. 03 04043

(51) Int. Cl.
*H03D 1/00*    (2006.01)
(52) U.S. Cl. ........................................ 375/340; 702/189
(58) Field of Classification Search ................ 375/340, 375/346, 350, 147; 702/189
See application file for complete search history.

(56) References Cited

U.S. PATENT DOCUMENTS

| | | | | |
|---|---|---|---|---|
| 6,711,528 | B2* | 3/2004 | Dishman et al. ............. | 702/189 |
| 2002/0097784 | A1* | 7/2002 | Brunel ........................ | 375/147 |
| 2002/0186418 | A1* | 12/2002 | Inoue ......................... | 358/3.14 |
| 2003/0204380 | A1* | 10/2003 | Dishman et al. ............ | 702/189 |
| 2004/0192216 | A1* | 9/2004 | Marzetta et al. ......... | 455/67.14 |

OTHER PUBLICATIONS

Cardoso J F et al: "Blind Beamforming For 1-10 Non-Gaussian Signals" Dec. 1, 1993, pp. 362-370.
Ferreol A et al: "On the behaviour of current second and higher order blind source separation methods for cyclostationary sources" New York, US; Jun. 6, 2000, pp. 1712-1725.
Ferreol A et al: "Higher order blind separation of non zero-mean cyclostationary sources" signal processing: Theories and Applications, proceedings of Eusipco, XX, XX, Sep. 22, 2002.
Cardoso J-F Ed -Institute of Electrical and Electornics engineers: "Super-symmetric decomposition of the fourth-order cumulant tensor. Blind identification of more sources than sensors."

* cited by examiner

*Primary Examiner*—Emmanuel Bayard
(74) *Attorney, Agent, or Firm*—Lowe, Hauptman, Ham & Berner LLP (57) ABSTRACT

A method for the fourth-order, blind identification of at least two sources in a system comprising a number of sources P and a number N or reception sensors receiving the observations, said sources having different tri-spectra. The method comprises at least the following steps: a step for the fourth-order whitening of the observations received on the reception sensors in order to orthonormalize the direction vectors of the sources in the matrices of quadricovariance of the observations used; a step for the joint diagonalizing of several whitened matrices of quadricovariance in order to identify the spatial signatures of the sources. Application to a communication network.

FIG. 3 to be published.

20 Claims, 6 Drawing Sheets

METHOD AND DEVICE FOR THE FOURTH-ORDER, BLIND IDENTIFICATION OF AN UNDER-DETERMINED MIXTURE OF SOURCES

BACKGROUND OF THE INVENTION

1. Field of the Invention

The invention relates especially to a method for the learned or blind identification of a number of sources P that is potentially greater than or equal to the number N of sensors of the reception antenna.

It can be used for example in the context of narrow-band multiple transmission.

It is used for example in a communications network.

It can be applied especially in the field of radio communications, space telecommunications or passive listening to these links in frequencies ranging for example from VLF to EHF.

Figure 1:
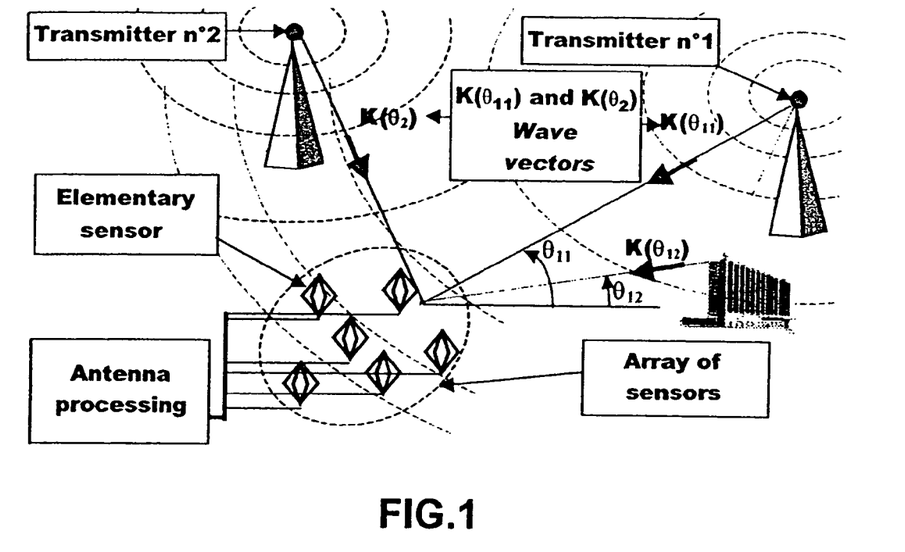
FIG. 1 shows an example of a communication network.
Figure 2:
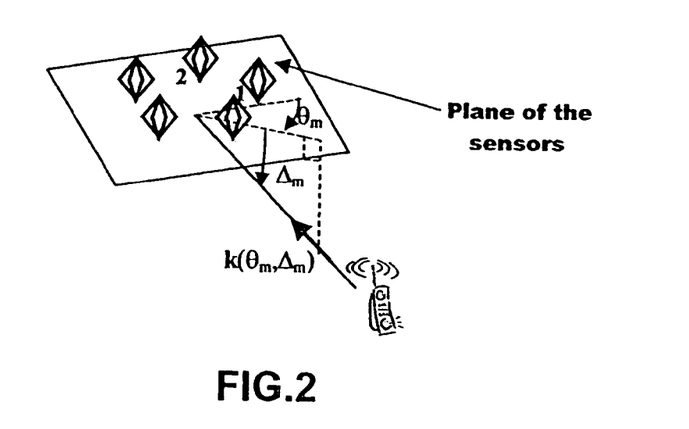
FIG. 2 shows parameters of a source.
Figure 3:
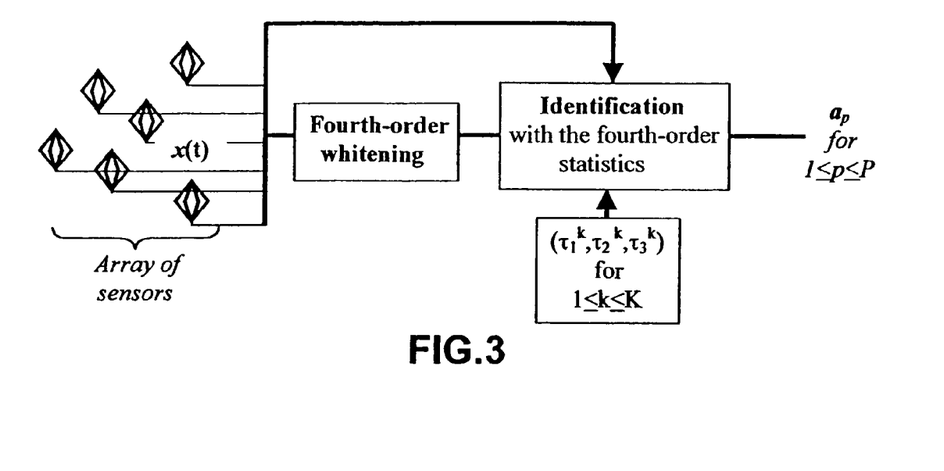
FIG. 3 is a functional diagram of the method according to the invention.

FIG. 1 is a schematic drawing exemplifying an array of several reception sensors or receivers, each sensor receiving signals from one or more radio communications transmitters from different directions of arrival Each sensor receives signals from a source with a phase and amplitude that are dependent on the angle of incidence of the source and the position of the sensor. FIG. 2 is a drawing exemplifying the parameterization of the direction of a source. This direction is parameterized by two angles corresponding to the azimuth angle $\theta$ and the elevation angle $\Delta$.

2. Description of the Prior Art

The past 15 years or so have seen the development of many techniques for the blind identification of signatures or source direction vectors, assumed to be statistically independent. These techniques have been developed in assuming a number of sources P smaller than or equal to the number of sensors N. These techniques have been described in the references [1][3][7] cited at the end of the description. However, for many practical applications such as HF radio communications, the number of sources from which signals are received by the sensors is increasing especially with the bandwidth of the receivers, and the number of sources P can therefore be greater than the number of sensors N. The mixtures associated with the sources are then said to be under-determined.

A certain number of methods for the blind identification of under-determined mixtures of narrow-band sources for networks have been developed very recently and are described in the references [2] [7-8] and [10]. The methods proposed in the references [2] and [7-8] make use of information contained in the fourth-order (OF) statistics of the signals received at the sensors while the method proposed in the reference [10] make use of the information contained in one of the characteristic functions of the signals received. However, these methods have severe limitations in terms of the prospects of their operational implementation. Indeed, the method described in the reference [2] is very difficult to implement and does not provide for the identification of the sources having the same kurtosis values (standardized fourth-order cumulant). The methods described in the references [7-8] assume that the sources are non-circular. These methods give unreliable results in practice. Finally, the reference method [10] has been developed solely for mixtures of sources with real (non-complex) values.

The object of the present invention relates especially to a new method for the blind identification of an under-determined mixture of narrow-band sources for communications networks. The method can be used especially to identify up to $N^2-N+1$ sources from N identical sensors and up to $N^2$ sources with N different sensors, in assuming only that the sources have different tri-spectra and non-zero, same-sign kurtosis values (this hypothesis is practically always verified in the context of radio communications).

SUMMARY OF THE INVENTION

The invention relates to a method for the fourth-order, blind identification of at least two sources in a system comprising a number of sources P and a number N of reception sensors receiving the observations, said sources having different tri-spectra, wherein the method comprises at least the following steps:
  a step for the fourth-order whitening of the observations received on the reception sensors in order to orthonormalize the direction vectors of the sources in the matrices of quadricovariance of the observations used,
  a step for the joint diagonalizing of several whitened matrices of quadricovariance in order to identify the spatial signatures of the sources.

The number of sources P is for example greater than the number of sensors N.

The method can be used in a communication network.

The method according to the invention has especially the following advantages:
  it enables the identification of a number of sources greater than the number of sensors:
    for identical sensors: $N^2-N+1$ sources having different tri-spectra and non-zero and same-sign kurtosis values,
    for different sensors (arrays with polarization diversity and/or pattern diversity and/or coupling etc) $N^2$ sources having different tri-spectra and non-zero, same sign kurtosis values,
  the method is robust with respect to Gaussian noise, even spatially correlated Gaussian noise,
  it enables the goniometry of each source identified, using a wavefront model attached to the signature, with a resolution potentially higher than that of existing methods,
  it enables the identification of I ($N^2-N+1$) cyclostationary sources if the sensors are identical and I×$N^2$ cyclostationary sources if the sensors are different: with polarization diversity and/or pattern diversity and/or coupling, where I is the number of cyclical frequencies processed,
  using a performance criterion, it enables the quantitative evaluation of the quality of estimation of the direction vector of each source and a quantitative comparison of two methods for the identification of a given source,
  using a step for the selection of the cyclical frequencies, it enables the processing of a number of sources greater than the number of sources processed by the basic method.

BRIEF DESCRIPTION OF THE DRAWINGS

Other features and advantages of the invention shall appear more clearly from the following description along with the appended figures, of which.

MORE DETAILED DESCRIPTION

For a clear understanding of the object of the invention, the following example is given by way of an illustration that in no way restricts the scope of the invention for a radio communications network in a multiple-transmission, narrow-band context, with sources having different tri-spectra (of cumulants).

Each sensor of the network, formed by N receivers, receives a mixture of P narrow-band (NB) sources which are assumed to be statistically independent. On this assumption, the vector of the complex envelopes of the signals at output of the sensors is written as follows:

$$x(t) = \sum_{p=1}^{P} S_p(t) a_p + b(t) = As(t) + b(t) \quad (1)$$

where $s_p(t)$ is the signal of the $p^{th}$ source as well as the $p^{th}$ component of the vector s(t), b(t) is the assumed Gaussian noise vector with any convariance, $a_p$ is the signature or the direction vector of the $p^{th}$ source and A (N×P) is the matrix of the vectors $a_p$ (direction vectors of the sources).

It is an object of the invention especially to identify the direction vectors $a_p$ of each of the sources when, especially, the number of sources P is potentially greater than the number of sensors N.

From this identification, it is then possible to apply techniques for the extraction of the sources by the spatial filtering of the observations. The blind extraction is aimed especially at restoring the information signals conveyed by the sources in not exploiting any a priori information (during normal operation) on these sources.

Fourth-order Statistics

The method according to the invention makes use of the fourth-order statistics of the observations corresponding to the time-domain averages $Q_x(\tau_1,\tau_2,\tau_3) = <Q_x(\tau_1,\tau_2,\tau_3)(t)>$, on an infinite horizon of observation, of certain matrices of quadricovariance, $Q_x(\tau_1,\tau_2,\tau_3)(t)$, sized (N²×N²). The elements, $Q_x(\tau_1,\tau_2,\tau_3)[i, j, k, l](t)$ of these matrices are, for example, defined by the relationship:

$$Q_x(\tau_1,\tau_2,\tau_3)[i, j, k, l]/t] = \text{Cum}(x_i(t), x_j(t-\tau_1)^*, x_k(t-\tau_2)^*, x_l(t-\tau_3)) \quad (2)$$

where * is the conjugate complex symbol, $x_i(t)$ is the $i^{th}$ component of the vector x(t), <.> is the operation of time-domain averaging on an infinite horizon of observation and $(\tau_1,\tau_2,\tau_3)$ is a triplet of delays. Assuming that $Q_x(\tau_1,\tau_2,\tau_3)[i, j, k, l]$ is the element [N(i-1)+j, N(k-1)+l] of the matrix $Q_x(\tau_1,\tau_2,\tau_3)$ assuming that the noise is Gaussian and using the expression (1) in the expression (2), the matrix of quadricovariance $Q_x(\tau_1,\tau_2,\tau_3)$ is written as follows:

$$Q_x(\tau_1,\tau_2,\tau_3) = (AA^*) Q_s(\tau_1,\tau_2,\tau_3)(AA^*)^H \quad (3)$$

where $Q_s(\tau_1,\tau_2,\tau_3)$ is the averaged matrix of quadricovariance of s(t) with a dimension (P²×P²), A=[$a_1 \ldots a_P$], is the Kronecker product and $^H$ designates the transpose and conjugate. Assuming statistically independent sources, the matrix $Q_s(\tau_1,\tau_2,\tau_3)$ is formed by at least P⁴–P zeros and the expression (3) is simplified as follows:

$$Q_x(\tau_1, \tau_2, \tau_3) = \sum_{p=1}^{P} c_p(\tau_1, \tau_2, \tau_3)(a_p \otimes a_p^*)(a_p \otimes a_p^*)^H \quad (4a)$$

$$= A_Q C_s(\tau_1, \tau_2, \tau_3) A_Q^H \quad (4b)$$

where $A_Q$ is a matrix sized (N²×P) defined by $A_Q = [(a_1 a_1^*), \ldots, (a_P a_P^*)]$, $C_s(\tau_1,\tau_2,\tau_3)$ is a diagonal matrix sized (P×P) defined by $C_s(\tau_1,\tau_2,\tau_3)=\text{diag}[c_1(\tau_1,\tau_2,\tau_3), \ldots, c_P(\tau_1,\tau_2,\tau_3)]$ and where $c_p(\tau_1,\tau_2,\tau_3)$ is defined by:

$$c_p(\tau_1,\tau_2,\tau_3) = <\text{Cum}(s_p(t), s_p(t-\tau_1)^*, s_p(t-\tau_2)^*, s_p(t-\tau_3))> \quad (5)$$

The expression (4b) has an algebraic structure similar to that of the correlation matrix of the observations used in the algorithm SOBI described in the reference [1]. The notation used here below will be $Q_x = Q_x(0, 0, 0)$, $c_p = c_p(0, 0, 0)$, $c_s = C_s(0, 0, 0)$ in order to deduce the relationship (4b) therefrom:

$$Q_x = A_Q C_s A_Q^H \quad (6)$$

It is assumed here below that the number of sources P is such that $P \leq N^2$, that the matrix $A_Q$ is full rank, that the averaged cumulants $c_p$, $1 \leq p \leq P$, are non-zero (non-Gaussian sources) and same-sign cumulants and that, for any pair (i, j) of sources, there is at least one triplet of delays $(\tau_1,\tau_2,\tau_3)$ such that $|\tau_1|+|\tau_2|+|\tau_3|\neq 0$ and $$c_i(\tau_1,\tau_2,\tau_3)/|c_i| \neq c_j(\tau_1,\tau_2,\tau_3)/|c_j| \quad (7)$$

Fourth-order Whitening Step

The first step of the method according to the invention, called FOBIUM, consists of the orthonormalization, in the matrix of quadricovariance $Q_x$ of the expression (6), of the columns of the matrix $A_Q$, considered to be virtual direction vectors of the sources for the array of sensors considered. To this end, the method considers the eigen-element decomposition of the P rank hermitian matrix $Q_x$ given by $$Q_x = E_x \Lambda_x E_x^H \quad (8)$$

where $\Lambda_x$ is the real longitudinal diagonal, with dimension (P×P), of the P non-zero eigenvalues of $Q_x$, and $E_x$ is the matrix sized (N²×P) of the associated, orthonormal eigenvectors. For a full-rank matrix $A_Q$, it can be shown that there is equivalence between assuming that the kurtosis values of the sources have a same sign $\epsilon$ ($\epsilon=\pm 1$) and assuming that the eigenvalues of $\Lambda_x$ also have a same sign $\epsilon$. In this context, it is possible to build the following whitening matrix T sized (P×N²):

$$T = (\Lambda_x)^{-1/2} E_x^H \quad (9)$$

The whitening matrix sized (P×N²) is defined from the square root of the real diagonal matrix sized (P×P) of the P non-zero eigenvalues of the matrix of quadricovariance and of the transpose of the matrix of the associated eigenvectors with a dimension (P×N²) where $(\Lambda_x)^{-1/2}$ is the inverse of the square root of $\Lambda_x$. From the expressions (6) and (8), it is deduced that:

$$\epsilon T Q_x T^H = T A_Q (\epsilon C_s) A_Q^H T^H = I_P \quad (10)$$

where $I_P$ is the identity matrix with a dimension (P×P) and where $\epsilon C_s = \text{diag}[|c_1|, \ldots, |c_P|]$. This expression shows that the matrix $TA_Q (\epsilon C_s)^{1/2}$ with a dimension (P×P) is a unitary matrix U. It is deduced from this that:

$$TA_Q = U(\epsilon C_s)^{-1/2} \quad (11)$$

Fourth-order Identification Step

From the expressions (4b) and (11), it is deduced that:

$$W(\tau_1,\tau_2,\tau_3) = TQ_x(\tau_1,\tau_2,\tau_3)T^H = U(\epsilon C^s)^{-1/2} C_s(\tau_1,\tau_2,\tau_3) (\epsilon C_s)^{-1/2} U^H \quad (12)$$

where $W(\tau_1,\tau_2,\tau_3)$ is the matrix of quadricovariance whitened at the fourth order by the matrix $Q_x$. This expression shows that the unitary matrix U diagonalized the matrices T $Q_x(\tau_1,\tau_2,\tau_3)$ $T^H$ and that the associated eigenvalues are the diagonal terms of the diagonal matrix $(\epsilon C_s)^{-1/2} C_s(\tau_1,\tau_2,\tau_3) (\epsilon C_s)^{-1/2}$. For a given triplet of delays $(\tau_1,\tau_2,\tau_3)$, the matrix U is unique, give or take one permutation and one unit diagonal matrix, when the elements of the matrix $(\epsilon C_s)^{-1/2} C_s(\tau_1,\tau_2,\tau_3) (\epsilon C_s)^{-1/2}$ all are different. If not, the method uses a set of K triplets $(\tau_1^k,\tau_2^k,\tau_3^k)$, $1 \leq k \leq K$, defined as follows: for all pairs of sources (i, j), there is at least one triplet $(\tau_1^k,\tau_2^k,\tau_3^k)$, such that the condition of the equation (7) is verified. In these conditions, the unitary matrix U is the only matrix $U_{sol}$ which, to the nearest permutation and to the nearest unit diagonal matrix, jointly diagonalizes the K matrices $T \times Q_x(\tau_1^k,\tau_2^k,\tau_3^k) \times T^H$. Consequently, the matrix $U_{sol}$, which resolves the above problem, is written as a function of the unitary matrix U as follows:

$$U_{sol} = U \Lambda \pi \quad (13)$$

where $\Lambda$ and $\pi$ are respectively the unit diagonal matrix and the permutation matrix referred to here above. From the equations (11) and (13), it is possible to deduce the matrix $A_Q$ to the nearest unit diagonal matrix and to the nearest permutation, which is expressed by:

$$T^\# U_{sol} = [b_1 \ldots b_P] = E_x \Lambda_x^{1/2} U_{sol} = A_q (\epsilon C_s)^{1/2} \Lambda \pi \quad (14)$$

where $T^\#$ is the pseudo-inverse of the matrix T. Each column, $b_l$ ($1 \leq l \leq P$), of the matrix $T^\# U_{sol}$ corresponds to one of the vectors $\mu_q |c_q|^{1/2} (a_q a_q^*)$, $1 \leq q \leq P$, where $\mu_q$ is a complex scalar value such that $|\mu_q| = 1$. Consequently, in converting each column $b_l$ of the matrix $T^\# U_{sol}$ into the matrix $B_l$ with a dimension (N×N) such that $B_l[i, j] = b_l((i-1)N+j)$ ($1 \leq i, j \leq N$), it is deduced therefrom that:

$$B_l = \mu hd\ q\ |c_q|^{1/2}\ a_q a_q^H \text{ pour } (1 \leq l, q \leq P) \quad (15)$$

The matrix $B_l$ is built from the vector $b_l$ and depends on a complex scalar value, the square root of the cumulant and the direction vector of the $q^{th}$ source and of its conjugate.

In this context, the direction vector $a_q$ of the $q^{th}$ source is associated with the eigenvector of $B_l$ associated with the highest eigenvalue.

Summary of the Principle of the Invention

In brief, the different steps of the method according to the invention include at least the following steps:
for L vector observations received in the course of the time: $x(lT_e)$ ($1 \leq l \leq L$), where $T_e$ is the sampling period.

Estimation

Step 1: The estimation, through $Q;\hat{}_x$, of the matrix of quadricovariance Qx, from the L observations $x(lT_e)$, using a non-skewed and asymptotically consistent estimator. Depending on the nature of the sources, the estimator is adapted as follows:
  Stationary and centered case: empirical estimator used in the reference [3].
  Cyclostationary and centered case: estimator implemented in the reference [10].
  Cyclostationary and non-centered case: estimator implemented in the reference [11].

Whitening

Step 2: The eigen-element decomposition of the estimated matrix of quadricovariance $Q;\hat{}_x$, estimating the number of sources P and restricting this eigenvalue decomposition to the P main components: $Q;\hat{}_x \approx E;\hat{}_x \Lambda;\hat{}_x E;\hat{}_x^H$, where $\Lambda;\hat{}_x$ is the diagonal matrix containing the P highest modulus eigenvalues and $E;\hat{}_x$ is the matrix containing the associated eigenvectors.

Step 3: The building of the whitening matrix: $T;\hat{} = (\Lambda;\hat{}_x)^{-1/2} E;\hat{}_x^H$.

Selection of the Triplets

Step 4: The selection of K triplets of delays $(\tau_1^k,\tau_2^k,\tau_3^k)$ where $|\tau_1^k|+|\tau_2^k|+|\tau_3^k| \neq 0$.

Estimation

Step 5: The estimation, through $Q;\hat{}_x(\tau_1^k,\tau_2^k,\tau_3^k)$, of K matrices of quadricovariance Qx $(\tau_1^k,\tau_2^k,\tau_3^k)$. As in the step 1, this estimation depends especially on the assumptions made on the observations:
  Stationary and centered case: empirical estimator used in the reference [3].
  Cyclostationary and centered case: estimator implemented in the reference [10].
  Cyclostationary and non-centered case: estimator implemented in the reference [11].

Identification

Step 6: The computation of the matrices $T;\hat{}Q;\hat{}_x(\tau_1^k,\tau_2^k,\tau_3^k) T;\hat{}^H$ and the estimation, by $U;\hat{}_{sol}$, of the unitary matrix $U_{sol}$ through the joint diagonalizing of the K matrices $T;\hat{}Q;\hat{}_x(\tau_1^k,\tau_2^k,\tau_3^k) T;\hat{}^H$.

Step 7: The computation of $T;\hat{}^{190} U;\hat{}_{sol} = [b;\hat{}_1 \ldots b;\hat{}_P]$ and the building of the matrices $B;\hat{}_l$ sized (N×N).

Step 8: The estimation, by $a;\hat{}_P$, of the signatures $a_q$ ($1 \leq q \leq P$) of the P sources in carrying out a decomposition into elements on each matrix $B;\hat{}_l$.

Applications

At the end of the step 8, the method has identified the direction vectors of P non-Gaussian sources having different tri-spectra with same-sign kurtosis values. $P < N^2$ and P may reach $N^2 - N + 1$ or $N^2$ depending on the type of sensors used.

Using this information, the method may implement a method of goniometry or a spatial filtering of antennas.

A method of goniometry can be used to determine the direction of arrival of the sources and more precisely the azimuth angle $\theta_m$ for 1D goniometry and azimuth and elevation angles $(\theta_m, \Delta_m)$ for 2D goniometry.

Figure 4:
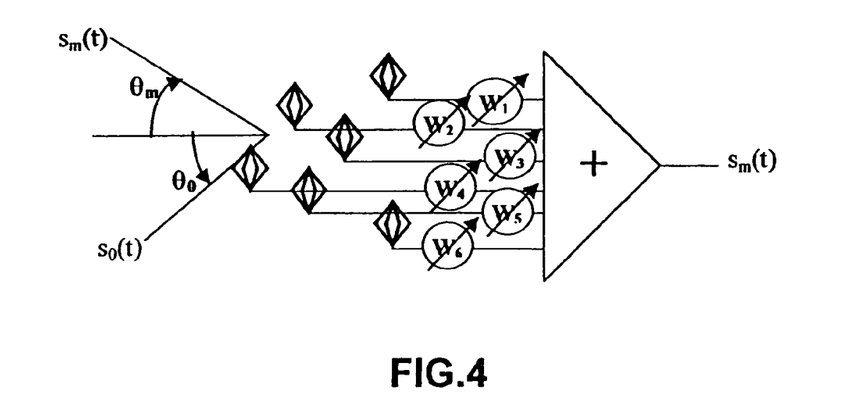
FIG. 4 shows an example of spatial filtering.

FIG. 4 represents a spatial filtering of antennas for spatial filtering structures. It enables especially the optimizing of reception from one or all the sources present by the spatial filtering of the observations. When several sources are of interest to the receiver, we speak of source separation techniques. When no a priori information on the sources is exploited, we speak of blind techniques.

Verification of the Quality of the Estimates

According to one alternative embodiment, the method comprises a step of qualitative evaluation, for each source, of the quality of identification of the associated direction vector.

This new criterion enables the intrinsic comparison of two methods of identification for the restitution of the signature of a particular source. This criterion, for the identification problem, is an extension of the one proposed in [5] for extraction. It is defined by the P-uplet:

$$D(A, \hat{A}) = (\alpha_1, \alpha_2, \ldots \alpha_P) \quad (16)$$

where $$\alpha_p = \min_{1 \leq i \leq P} [d(a_p, \hat{a}_i)] \quad (17)$$

and where d(u,v) is the pseudo-distance between the vectors u and v, such that:

$$d(u, v) = 1 - \frac{|u^H v|^2}{(u^H u)(v^H v)}. \quad (18)$$

Figure 5:
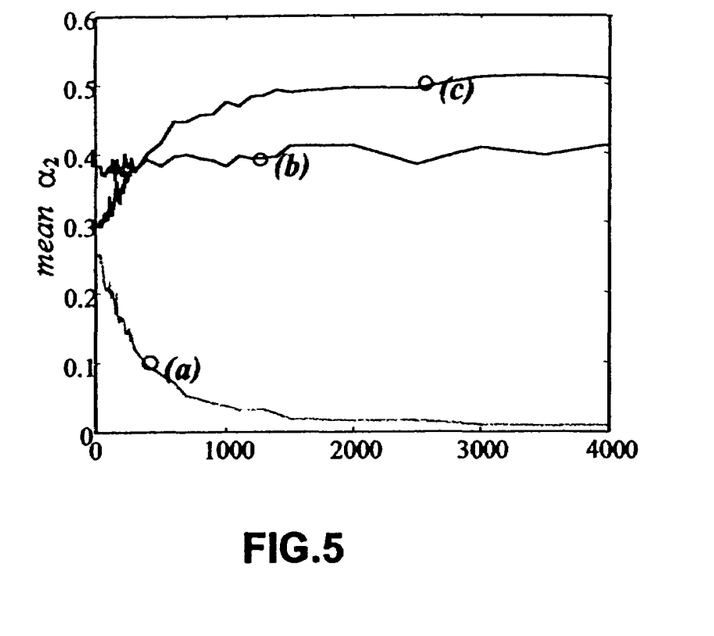
FIGS. 5 and 6 show examples of variations of the performance criterion as a function of the number of samples observed, comparing the performance of the method with two prior art methods.
Figure 6:
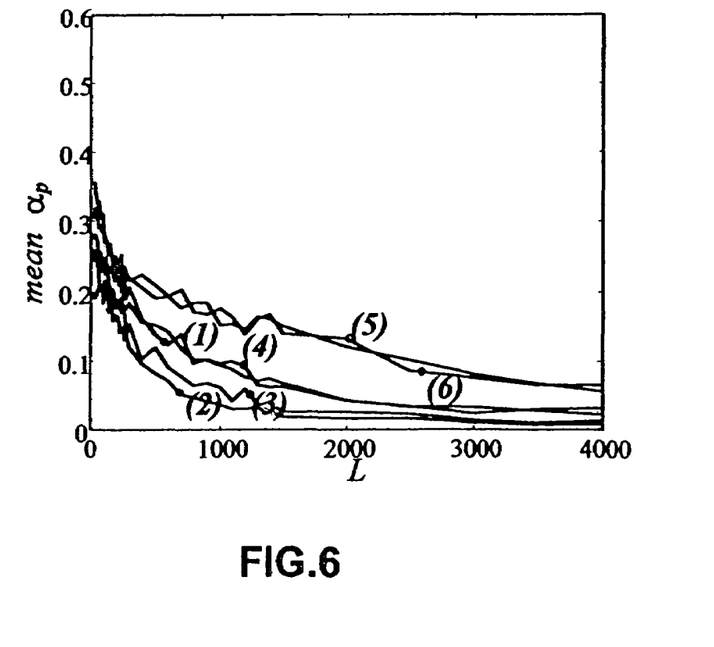

In the simulations of FIGS. 5 and 6, there are P=6 statistically independent sources received on a circular array of N=3 sensors having a radius r such that r/λ=0.55 (λ: wavelength). The six sources are non-filtered QPSK sources having a signal-to-noise ratio of 20dB with a symbol period T=4 $T_e$, where $T_e$ is the sampling period.

The incidence values of the sources are such that $\theta_1$=2.16°, $\theta_2$=25.2°, $\theta_3$=50°, $\theta_4$=272.16°, $\theta_5$=315.36°, $\theta_6$=336.96° and the associated carrier frequencies verify $\Delta f_1 T_e$=0, $\Delta f_2 T_e$=½, $\Delta f_3 T_e$=⅓, $\Delta f_4 T_e$=⅕, $\Delta f_5 T_e$=1/7 and $\Delta f_6 T_e$=1/11. The JADE [3], SOBI [1] and FOBIUM method according to the invention are applied and the performance values $\alpha_q$ for q=1 . . . 6 are evaluated after an averaging operation on 1000 results. For the FOBIUM method, we choose K=4 triplets of delays $(\tau_1^k, \tau_2^k, \tau_3^k)$ where $\tau_1^k = kT_e$ and $\tau_2^k = \tau_3^k = 0$.

In the above assumptions, FIG. 5 shows the variation in $\alpha_2$ (performance of the second source) resulting from the JADE (b), SOBI (c) and FOBIUM (a) separators as a function of the number L of samples. The curves show firstly that the JADE and SOBI methods present difficulties in identifying the direction vector of the second source in an under-determined mixture context and that, secondly, that the FOBIUM method performs very well.

FIG. 6 gives a view, in the same context, of the variations of all the $\alpha_p$ (1≦p≦6) values resulting from the FOBIUM method as a function of L. The curve (index p) is associated with the $p^{th}$ source. It can be seen that all the coefficients $\alpha_p$ converge towards zero and that, symptomatically, the direction vectors are perfectly identified.

Variants of the Cyclical FOBIUM Method

Figure 7:
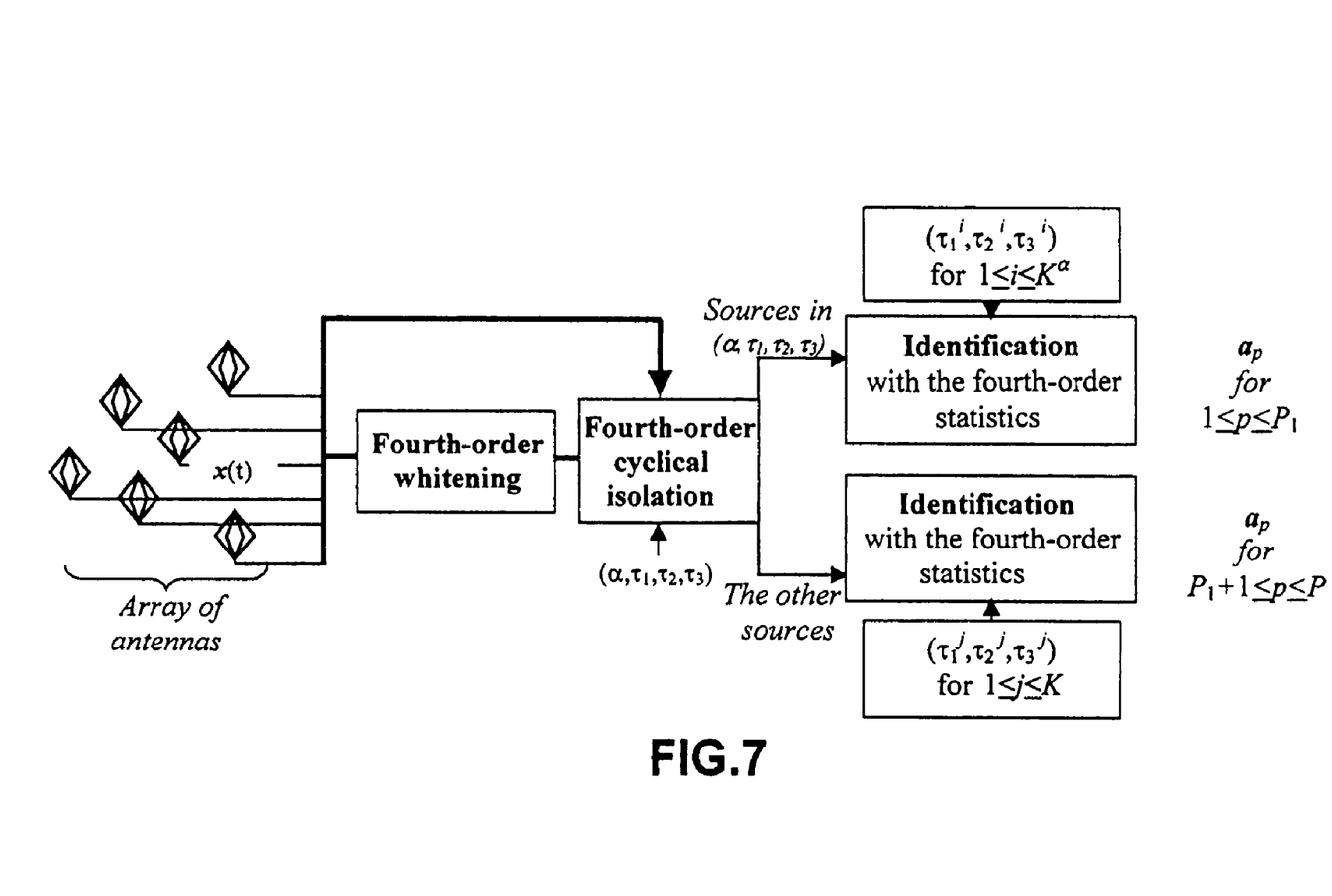
FIGS. 7 to 9 show three alternative embodiments of the method described in FIG. 3 implementing a selection of the cyclical frequencies.
Figure 8:
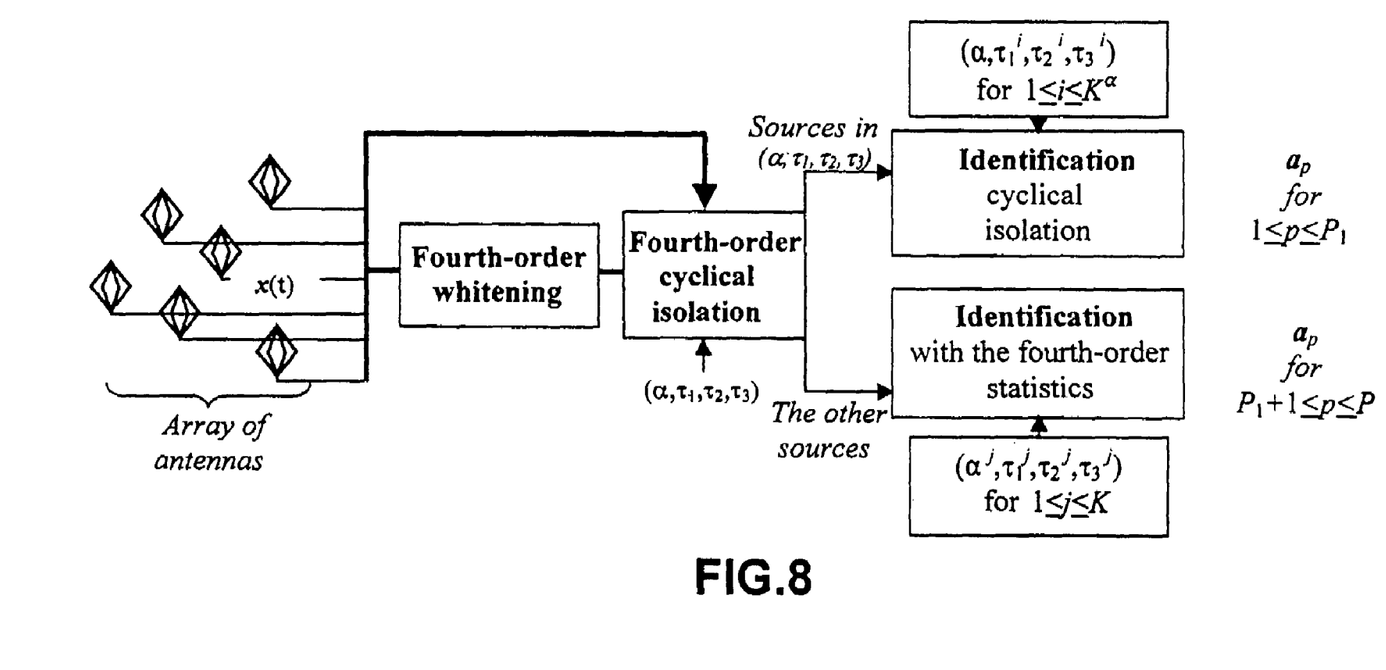

FIGS. 7 and 8 show two examples of variants of the method according to the invention known as the cyclical FOBIUM method.

The idea lies especially in introducing selectivity by the cyclical frequencies into the method presented here above and is aimed especially at the blind identification, with greater processing capacity, of under-determined mixtures of cyclostationary sources.

The major difference between the steps 1 to 8 explained here above and this variant is the implementation of a step for the cyclical isolation of the sources by fourth-order discrimination according to their cyclical frequencies. It is thus possible to separately identify the sources associated with a same fourth-order cyclical parameter without being disturbed by the other sources processed separately.

Figure 9:
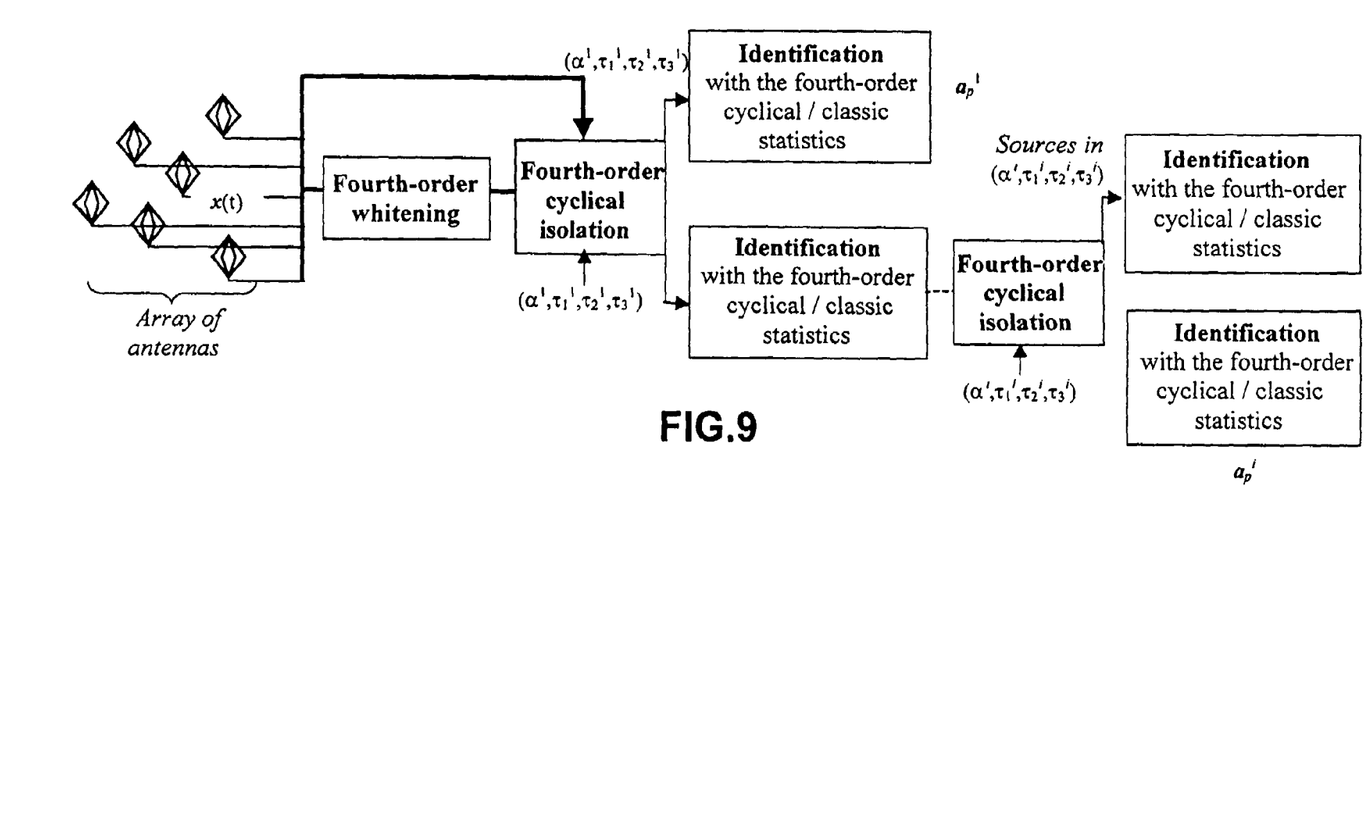

The two variants shown in FIGS. 7 and 8 can be implemented by reiterating the process of cyclical isolation on the "other sources" with other cyclical parameters. The process of cyclical isolation can be applied several times in a third version illustrated in FIG. 9.

Fourth-order Cyclical Statistics

The fourth-order cyclical statistics of the observations or sensor signals used are characterized by the matrices of cyclical quadricovariance $Q_x^\epsilon(\alpha, \tau_1, \tau_2, \tau_3)$ with a dimension (N²×N²) where the elements $Q_x^\epsilon(\alpha, \tau_1, \tau_2, \tau_3)[i, j, k, l]$, are defined by:

$$Q_x^1(\alpha,\tau_1,\tau_2,\tau_3)[i, j, k, l] = <\text{Cum}(x_i(t), x_j(t-\tau_1)^*, x_k(t-\tau_2)^*, x_l(t-\tau_3)) \exp(-j2\pi\alpha t)>$$

$$Q_x^2(\alpha,\tau_1,\tau_2,\tau_3)[i, j, k, l] = <\text{Cum}(x_i(t), x_j(t-\tau_1)^*, x_k(t-\tau_2), x_l(t-\tau_3)) \exp(-j2\pi\alpha t)>$$

$$Q_x^3(\alpha,\tau_1,\tau_2,\tau_3)[i, j, k, l] = <\text{Cum}(x_i(t), x_j(t-\tau_1), x_k(t-\tau_2), x_l(t-\tau_3)) \exp(-j2\pi\alpha t)> \quad (19)$$

It can be seen that $Q_x^{68}(\alpha, \tau_1, \tau_2, \tau_3)$ is associated with the $\epsilon^{th}$ fourth-order moment. In stating that $Q_x^\epsilon(\alpha, \tau_1, \tau_2, \tau_3)[i, j, k, l]$ is the element [N(i−1)+j, N(k−1)+l] of the matrix $Q_x^\epsilon(\alpha, \tau_1, \tau_2, \tau_3)$, and assuming that the noise is Gaussian, the matrix $Q_x^\epsilon(\alpha, \tau_1, \tau_2, \tau_3)$, is written as follows, in using (1) and (19):

$$Q_x^1(\alpha,\tau_1,\tau_2,\tau_3) = (AA^*) Q_s^1(\alpha,\tau_1,\tau_2,\tau_3)(AA^*)^H$$

$$Q_x^2(\alpha,\tau_1,\tau_2,\tau_3) = (AA^*) Q_s^2(\alpha,\tau_1,\tau_2,\tau_3)(AA)^T$$

$$Q_x^3(\alpha,\tau_1,\tau_2,\tau_3) = (AA) Q_s^3(\alpha,\tau_1,\tau_2,\tau_3)(AA)^T \quad (20)$$

Where $Q_s^\epsilon(\alpha, \tau_1, \tau_2, \tau_3)$ is a cyclical matrix of quadricovariance s(t) with a dimension (P²×P²), is the Kronecker product and $^T$ designates the transpose. On the assumption of statistically independent sources, the matrix $Q_s^\epsilon(\alpha, \tau_1, \tau_2, \tau_3)$ is formed by at least P⁴−P zeros and the expression (20) is simplified as follows:

$$Q_x^1(\alpha, \tau_1, \tau_2, \tau_3) = \sum_{p=1}^{P} c_p^1(\alpha, \tau_1\tau_2\tau_3)(a_p \otimes a_p^*)(a_p \otimes a_p^*)^H = A_Q C_s^1(\alpha, \tau_1, \tau_2, \tau_3) A_Q^H \quad (21)$$

$$Q_x^2(\alpha, \tau_1, \tau_2, \tau_3) = \sum_{p=1}^{P} c_p^2(\alpha, \tau_1\tau_2\tau_3)(a_p \otimes a_p^*)(a_p \otimes a_p)^T = A_Q C_s^2(\alpha, \tau_1, \tau_2, \tau_3) B_Q^T$$

$$Q_x^3(\alpha, \tau_1, \tau_2, \tau_3) = \sum_{p=1}^{P} c_p^3(\alpha, \tau_1\tau_2\tau_3)(a_p \otimes a_p)(a_p \otimes a_p)^T = B_Q C_s^3(\alpha, \tau_1, \tau_2, \tau_3) B_Q^T$$

where $A_Q$ and $B_Q$ are matrices with a dimension of (N²×P) defined by $A_Q = [(a_1 a_1^*), \ldots, (a_p a_p^*)]$ and $B_Q = [(a_1 a_1), \ldots, (a_p a_p)]$, $C_s^\epsilon(\alpha, \tau_1, \tau_2, \tau_3)$ is a diagonal matrix sized (P×P) defined by $C_s^\epsilon(\alpha, \tau_1, \tau_2, \tau_3) = \text{diag}[C_1^\epsilon(\alpha, \tau_1, \tau_2, \tau_3), \ldots, C_p^\epsilon(\alpha, \tau_1, \tau_2, \tau_3)]$ and where $C_p^\epsilon(\alpha, \tau_1, \tau_2, \tau_3)$ is defined by:

$$c_p^1(\alpha,\tau_1,\tau_2,\tau_3) = <\text{Cum}(s_p(t), s_p(t-\tau_1)^*, s_p(t-\tau_2)^*, s_p(t-\tau_3)) \exp(-j2\pi\alpha t)>$$

$$c_p^2(\alpha,\tau_1,\tau_2,\tau_3) = <\text{Cum}(s_p(t), s_p(t-\tau_1)^*, s_p(t-\tau_2), s_p(t-\tau_3)) \exp(-j2\pi\alpha t)>$$

$$c_p^3(\alpha,\tau_1,\tau_2,\tau_3) = <\text{Cum}(s_p(t), s_p(t-\tau_1), s_p(t-\tau_2), s_p(t-\tau_3)) \exp(-j2\pi\alpha t)> \quad (22)$$

It can be seen that the classic quadricovariance of (6) also verifies that $Q_x = Q_x^1(0, 0, 0, 0)$, $c_p = c_p^1(0, 0, 0, 0)$, $C_s = C_s^1(0,0, 0, 0)$. Recalling that $Q_x[i, j, k, l]$ is the element $[N(i-1)+j, N(k-1)+l]$ of the matrix $Q_x$, the following is deduced:

$$Q_x = A_Q C_s A_Q^H \quad (23)$$

In stating that $Q_x[i, j, k, l]$ is the element $[N(i-1)+l, N(k-1)+j]$ of $\tilde{Q}_x$ we obtain the matrix $\tilde{Q}_x$ which is written as follows:

$$\tilde{Q}_x = B_Q C_s B_Q^H \quad (24)$$

Whitening step

The first step of the cyclical method orthonormalizes the columns of the matrices $A_Q$ or $B_Q$ contained in the matrices $Q_x$ or $\tilde{Q}_x$ of the expressions (23)(24). The matrices $Q_x$ and $\tilde{Q}_x$ rank hermitian matrices and verify the following eigen-element decomposition:

$$Q_x = E_x \hat{\Lambda}_x E_x^H \text{ et } \tilde{Q}_x = \tilde{E}_x \tilde{\Lambda}_x \tilde{E}_x^H \quad (25)$$

Where $\hat{\Lambda}_x$ is the diagonal matrix sized (P×P) of the P non-zero values of $\tilde{Q}_x$ and $\tilde{E}_x$ is the matrix sized ($N^2$×P) of the associated eigenvectors. For a full-rank matrix $B_Q$, it can be shown that there is an equivalence assuming that that the kurtosis values of the sources have a same sign $\epsilon$ ($\epsilon = \pm 1$) and assuming that the eigenvalues of $\tilde{\Lambda}_x$ also have a same sign $\epsilon$. In this context, the whitening matrix can be built according to $\tilde{T}$ with a dimension of (P×$N^2$):

$$\tilde{T} = (\tilde{\Lambda}_x)^{-1/2} \tilde{E}_x^H \quad (26)$$

where $(\tilde{\Lambda}_x)^{-1/2}$ is the inverse of the square root of $\tilde{\Lambda}_x$. From the expressions (24) and (25), it is deduced that:

$$\epsilon \tilde{T} \tilde{Q}_x \tilde{T}^H = \tilde{T} B_Q (\epsilon C_s) B_Q^H \tilde{T}^H = I_P \quad (27)$$

This expression shows that the matrix $\tilde{T} B_Q (\epsilon C_s)^{1/2}$ with a dimension (P×P) is a unitary matrix $\tilde{U}$. It is then deduced from this that:

$$\tilde{T} B_Q = \tilde{U} (\epsilon C_s)^{-1/2} \quad (28)$$

It is recalled that the whitening matrix T of $Q_x$ verifies:

$$T A_Q = U (\epsilon C_s)^{-1/2} \quad (29)$$

Step of Cyclical Isolation

From the expressions (28)(29) and (21), it is deduced that:

$$W_x^1(\alpha,\tau_1,\tau_2,\tau_3) = T Q_x^1(\alpha,\tau_1,\tau_2,\tau_3) T^H = U(\epsilon C^s)^{-1/2} C_s^1(\alpha,\tau_1,\tau_2,\tau_3)(\epsilon C_s)^{-1/2} U^H$$

$$W_x^2(\alpha,\tau_1,\tau_2,\tau_3) = T Q_x^2(\alpha,\tau_1,\tau_2,\tau_3) \tilde{T}^T = U(\epsilon C^s)^{-1/2} C_s^2(\alpha,\tau_1,\tau_2,\tau_3)(\epsilon C_s)^{-1/2} \tilde{U}^T$$

$$W_x^2(\alpha,\tau_1,\tau_2,\tau_3) = \tilde{T} Q_x^2(\alpha,\tau_1,\tau_2,\tau_3) \tilde{T}^T = \tilde{U} (\epsilon C^s)^{-1/2} C_s^3(\alpha,\tau_1,\tau_2,\tau_3)(\epsilon C_s)^{-1/2} \tilde{U}^T \quad (30)$$

When there are $P_1$ sources verifying $c_i^\epsilon(\alpha,\tau_1,\tau_2,\tau_3) \neq 0$ ($1 \leq i \leq P_1$), the matrix $W_x^\epsilon(\alpha,\tau_1,\tau_2,\tau_3)$ is a $P_1 \leq P$ ranking matrix. Thus, the unitary matrices U and $\tilde{U}$ with a dimension P×P may be decomposed into two sub-matrices with a dimension P×$P_1$ and P×(P−$P_1$) such that:

$$U = [U_1 \ U_2] \text{ and } \tilde{U} = [\tilde{U}_1 \ \tilde{U}_2] \quad (31)$$

where the matrices $U_1$ and $\tilde{U}_1$ are sized P×$P_1$ and $U_2$ and $\tilde{U}_2$ are sized P×(P−$P_1$). The matrices $U_1$ and $\tilde{U}_1$ contain the singular vectors associated with the non-zero singular values of $W_x^\epsilon(\alpha,\tau_1,\tau_2,\tau_3)$. It is deduced from this that:

$$W_x^1(\alpha,\tau_1,\tau_2,\tau_3) = T Q_x^1(\alpha,\tau_1,\tau_2,\tau_3) T^H = U_1 (\epsilon \tilde{C}_s)^{-1/2} \tilde{C}_s^1(\alpha,\tau_1,\tau_2,\tau_3)(\epsilon \tilde{C}_s)^{-1/2} U_1^H$$

$$W_x^2(\alpha,\tau_1,\tau_2,\tau_3) = T Q_x^2(\alpha,\tau_1,\tau_2,\tau_3) \tilde{T}^T = U_1 (\epsilon \tilde{C}_s)^{-1/2} \tilde{C}_s^2(\alpha,\tau_1,\tau_2,\tau_3)(\epsilon \tilde{C}_s)^{-1/2} \tilde{U}_1^T$$

$$W_x^3(\alpha,\tau_1,\tau_2,\tau_3) = \tilde{T} Q_x^3(\alpha,\tau_1,\tau_2,\tau_3) \tilde{T}^T = \tilde{U}_1 (\epsilon \tilde{C}_s)^{-1/2} \tilde{C}_s^3(\alpha,\tau_1,\tau_2,\tau_3)(\epsilon \tilde{C}_s)^{-1/2} \tilde{U}_1^T \quad (32)$$

Where the matrix $\tilde{C}_s^\epsilon(\alpha,\tau_1,\tau_2,\tau_3)$ is a diagonal matrix sized $P_1 \times P_1$ formed by non-zero, diagonal elements $c_i^\epsilon(\alpha,\tau_1,\tau_2,\tau_3)$ of the matrix $C_s^\epsilon(\alpha,\tau_1,\tau_2,\tau_3)$. The matrix $\tilde{C}_s = \tilde{C}_s^1(0,0,0,0)$ sized $P_1 \times P_1$ is formed by corresponding elements $c_i$ ($1 \leq i \leq P_1$). Thus, after a singular value decomposition of $W_x^\epsilon(\alpha,\tau_1,\tau_2,\tau_3)$, it is possible to determine the matrices $T_1$ and $\tilde{T}_1$ from singular values associated with the non-zero singular values and $T_2$ and $\tilde{T}_2$ from singular vectors associated with the zero singular values such that:

$$T_1 = U_1 \pi_1^H, \ T_2 = U_2 \pi_2^H, \ \tilde{T}_1 = \tilde{U}_1 \tilde{\pi}_1^H \text{ et } \tilde{T}_2 = \tilde{U}_2 \tilde{\pi}_2^H \quad (33)$$

where the matrices are $\pi_1$, $\pi_2$, $\tilde{\pi}_1$ and $\tilde{\pi}_2$ are unitary. From $W_x^\epsilon(\alpha',\tau_1',\tau_2',\tau_3')$, it is possible to build a matrix $\tilde{W}_x^\epsilon(\alpha',\tau_1',\tau_2',\tau_3')$ depending solely on the sources of cyclical parameters $(\alpha,\tau_1,\tau_2,\tau_3,\epsilon)$ such that $c_i^\epsilon(\alpha,\tau_1,\tau_2,\tau_3) \neq 0$. To do this, the following computation is made:

$$\tilde{W}_x^1(\alpha',\tau_1',\tau_2',\tau_3') = T_1^H W_x^1(\alpha',\tau_1',\tau_2',\tau_3') T_1 = \pi_1 (\epsilon \tilde{C}_s)^{-1/2} \tilde{C}_s^1(\alpha',\tau_1',\tau_2',\tau_3')(\epsilon \tilde{C}_s)^{-1/2} \pi_1^H$$

$$\tilde{W}_x^2(\alpha',\tau_1',\tau_2',\tau_3') = T_1^H W_x^2(\alpha',\tau_1',\tau_2',\tau_3') \tilde{T}_1^* = \pi_1 (\epsilon \tilde{C}_s)^{-1/2} \tilde{C}_s^2(\alpha',\tau_1',\tau_2',\tau_3')(\epsilon \tilde{C}_s)^{-1/2} \tilde{\pi}_1^T$$

$$\tilde{W}_x^3(\alpha',\tau_1',\tau_2',\tau_3') = \tilde{T}_1^H W_x^3(\alpha',\tau_1',\tau_2',\tau_3') \tilde{T}_1^* = \tilde{\pi}_1 (\epsilon \tilde{C}_s)^{-1/2} \tilde{C}_s^3(\alpha',\tau_1',\tau_2',\tau_3')(\epsilon \tilde{C}_s)^{-1/2} \tilde{\pi}_1^T \quad (34)$$

Similarly, from $W_x^\epsilon(\alpha',\tau_1',\tau_2',\tau_3')$ it is possible to build a matrix $\tilde{\tilde{W}}_x^\epsilon(\alpha',\tau_1',\tau_2',\tau_3')$ that does not depend on the sources of cyclical parameters $(\alpha,\tau_1,\tau_2,\tau_3,\epsilon)$ such as $c_i^\epsilon(\alpha,\tau_1,\tau_2,\tau_3) = 0$: Other sources. To do this, the following computation is performed:

$$\tilde{\tilde{W}}_x^1(\alpha',\tau_1',\tau_2',\tau_3') = T_2^H W_x^1(\alpha',\tau_1',\tau_2',\tau_3')$$

$$T_2 = \pi_2 (\epsilon \tilde{C}_s)^{-1/2} \tilde{\tilde{C}}_s^1(\alpha',\tau_1',\tau_2',\tau_3')(\epsilon \tilde{C}_s)^{-1/2} \pi_2^H$$

$$\tilde{\tilde{W}}_x^2(\alpha',\tau_1',\tau_2',\tau_3') = T_2^H W_x^2(\alpha',\tau_1',\tau_2',\tau_3')$$

$$\tilde{T}_2^* = \pi_2 (\epsilon \tilde{C}_s)^{-1/2} \tilde{\tilde{C}}_s^2(\alpha',\tau_1',\tau_2',\tau_3')(\epsilon \tilde{C}_s)^{-1/2} \tilde{\pi}_2^T$$

$$\tilde{\tilde{W}}_x^3(\alpha',\tau_1',\tau_2',\tau_3') = \tilde{T}_2^H W_x^3(\alpha',\tau_1',\tau_2',\tau_3')$$

$$\tilde{T}_2^* = \tilde{\pi}_2 (\epsilon \tilde{C}_s)^{-1/2} \tilde{\tilde{C}}_s^3(\alpha',\tau_1',\tau_2',\tau_3')(\epsilon \tilde{C}_s)^{-1/2} \tilde{\pi}_2^T \quad (35)$$

where the matrix $\tilde{\tilde{C}}_s^\epsilon(\alpha',\tau_1',\tau_2',\tau_3')$ is a diagonal matrix with dimensions (P−$P_1$)×(P−$P_1$) formed by diagonal elements $c_i^{\epsilon''}(\alpha',\tau_1',\tau_2',\tau_3')$ such that the corresponding elements $c_i^\epsilon(\alpha,\tau_1,\tau_2,\tau_3)$ are zero elements. The matrix $\tilde{\tilde{C}}_s$ sized (P−$P_1$)×(P−$P_1$) is formed by the corresponding elements $c_i$ ($1 \leq i \leq P_1$).

In particular, in the first version of this variant, it is possible to carry out the cyclical isolation in $\alpha' = 0$ and $\epsilon' = 1$. Writing $W(\alpha',\tau_1',\tau_2',\tau_3') = W_x^\epsilon(\alpha',\tau_1',\tau_2',\tau_3')$, $\tilde{C}_s(\alpha',\tau_1',\tau_2',\tau_3') = \tilde{C}_s^\epsilon(\alpha',\tau_1',\tau_2',\tau_3')$ and $\tilde{\tilde{C}}_s(\alpha',\tau_1',\tau_2',\tau_3') = \tilde{\tilde{C}}_s^\epsilon(\alpha',\tau_1',\tau_2',\tau_3')$, the equations (34) and (35) become:

$$\tilde{W}_x(\tau_1',\tau_2',\tau_3') = T_1^H W_x(\tau_1',\tau_2',\tau_3') T_1 = \pi_1 (\epsilon \check{C}_s)^{-1/2} \check{C}_s (\tau_1',\tau_2',\tau_3')(\epsilon \check{C}_s)^{-1/2} \pi_1^H \quad (36)$$

$$\tilde{W}_x(\tau_1',\tau_2',\tau_3') = T_2^H W_x(\tau_1',\tau_2',\tau_3') T_2 = \pi_2 (\epsilon \check{C}_s)^{-1/2} \check{C}_s (\tau_1',\tau_2',\tau_3')(\epsilon \check{C}_s)^{-1/2} \pi_2^H \quad (37)$$

Identification step

The equations (34) and (36) show that it is possible to identify the unitary matrices $\pi_1$ and $\tilde{\pi}_1$ associated with the sources of cyclic parameters $(\alpha, \tau_1, \tau_2, \tau_3, \epsilon)$ in carrying out the joint SVD (singular value decomposition) of the matrices $\tilde{W}_x^{ej}(\alpha^j, \tau_1^j, \tau_2^j, \tau_3^j)$ for $1 \leq j \leq K$. Thus, to estimate the left unitary matrix, the joint diagonalizing of the matrices is performed:

$$\tilde{W}_x^{ej}(\alpha^j, \tau_1^j, \tau_2^j, \tau_3^j) \tilde{W}_x^{ej}(\alpha^j, \tau_1^j, \tau_2^j, \tau_3^j)^H \text{ for } 1 \leq j \leq K \quad (38)$$

and to estimate the right unitary matrix, the joint diagonalizing of the matrices is performed:

$$\tilde{W}_x^{ej}(\alpha^j, \tau_1^j, \tau_2^j, \tau_3^j)^H \tilde{W}_x^{ej}(\alpha^j, \tau_1^j, \tau_2^j, \tau_3^j) \text{ for } 1 \leq j \leq K \quad (39)$$

To estimate the unitary matrices $\pi_2$ and $\tilde{\pi}_2$ associated with the sources not associated with the cyclical parameters $(\alpha, \tau_1, \tau_2, \tau_3, \epsilon)$, the joint SVD of the matrices $\tilde{W}_x^{ej}(\alpha^j, \tau_1^j, \tau_2^j, \tau_3^j)$ for $1 \leq j \leq K$ is performed in jointly diagonalizing the matrices $\tilde{W}_x^{ej}(\alpha^j, \tau_1^j, \tau_2^j, \tau_3^j) \tilde{W}_x^{ej}(\alpha^j, \tau_1^j, \tau_2^j, \tau_3^j)^H$ and then the matrices $\tilde{W}_x^{ej}(\alpha^j, \tau_1^j, \tau_2^j, \tau_3^j)^H \tilde{W}_x^{ej}(\alpha^j, \tau_1^j, \tau_2^j, \tau_3^j)$.

Knowing $\pi_1$ and $\pi_2$, from the equation (33), the unitary matrices $U_1$, $U_2$ and $U$ are deduced to the nearest permutation matrix, in performing:

$$U_1 = T_1 \pi_1, \; U_2 = T_2 \pi_2 \text{ et } U = [U_1 \; U_2] \quad (40)$$

From the equations (9) and (29), it is possible to deduce the matrix $A_Q$ to the nearest diagonal matrix and permutation matrix, such that:

$$T^\# U = [b_1 \ldots b_P] = E_x \Lambda_x^{1/2} = A_Q (\epsilon C_s)^{1/2} \Lambda \pi \quad (41)$$

where $T^\#$ is the pseudo-inverse of the matrix T. Each column, $b_l$ ($1 \leq l \leq P$), of the matrix $T^\# U$ is associated with a vector $\mu_q |c_q|^{1/2} (a_q a_q^*)$, $1 \leq q \leq P$, where $\mu_q$ is a complex scalar value such that $|\mu_q| = 1$. As a consequence, in converting each column $b_l$ of the matrix $T^\# U$ into a matrix $B_l$ sized (N×N) such that $B_l[i, j] = b_l((i-1)N+j)$ ($1 \leq i, j \leq N$), it is deduced that:

$$B_l = \mu_q |c_q|^{1/2} a_q a_q^H \text{ for } (1 \leq l, q \leq P) \quad (42)$$

In this context, the direction vector $a_q$ of the $q^{th}$ source is associated with the eigenvector of $B_l$ associated with the greatest eigenvalue.

Recapitulation of the First Version of the Cyclical Procedure

In short, the steps of the first version of the cyclical method are summarized here below and are applied to L observations $x(lT_e)$ ($1 \leq l \leq L$) of the signals received on the sensors ($T_e$: sampling period).

Estimation

Step-1: The estimation of the matrices $Q_x$ and $\tilde{Q}_x$ from the L observations $x(lT_e)$. The estimation of these matrices will depend on the following assumptions:

Stationary and centered case: empirical estimator used in the reference [3].

Cyclostationary and centered case: estimator implemented in the reference [10].

Cyclostationary and non-centered case: estimator implemented in the reference [11].

Whitening

Step-2: The eigen-element decomposition of the estimates of the matrices $Q_x$ and $\tilde{Q}_x$. From these operations of decomposition, the estimation of the number of sources P and the use of the P main eigenvalues such that: $Q_x \approx E_x \Lambda_x E_x^H$ et $\tilde{Q}_x = \tilde{E}_x \tilde{\Lambda}_x \tilde{E}_x^H$ where $\Lambda_x$ and $\tilde{\Lambda}_x$ are diagonal matrices containing the P eigenvalues with the highest modulus and $E_x$ and $\tilde{E}_x$ are the matrices containing the associated eigenvectors.

Step-3: The building of the whitening matrices: $T = (\Lambda_x)^{-1/2} E_x^H$ and $\tilde{T} = (\tilde{\Lambda}_x)^{-1/2} \tilde{E}_x^H$ Step-4: The selection of the cyclical parameters $(\alpha, \tau_1, \tau_2, \tau_3, \epsilon)$ and the estimation of the matrix $Q_x^\epsilon(\alpha, \tau_1, \tau_2, \tau_3)$ from the L observations $x(lT_e)$. The estimation of this matrix will depend on the following assumptions on the signals:

Stationary and centered case: empirical estimator used in the reference [3].

Cyclostationary and centered case: estimator implemented in the reference [10].

Cyclostationary and non-centered case: estimator implemented in the reference [11].

Step-5: The computation of a matrix $W_x^\epsilon(\alpha, \tau_1, \tau_2, \tau_3)$ of (30) from matrices $Q_x^\epsilon(\alpha, \tau_1, \tau_2, \tau_3)$, T and $\tilde{T}$. After singular value decomposition $W_x^\epsilon(\alpha, \tau_1, \tau_2, \tau_3)$, the determining of the unitary matrices $T_1$ and $\tilde{T}_1$ associated with the non-zero singular values and $T_2$ and $\tilde{T}_2$ associated with the zero singular values.

Selection

Step-6: The selection of the K triplets $(\tau_1^k, \tau_2^k, \tau_3^k)$ where $|\tau_1^k| + |\tau_2^k| + |\tau_3^k| \neq 0$.

Estimation

Step-7: The estimation of the K matrices $Q_x(\tau_1^k, \tau_2^k, \tau_3^k)$ of (2). As in the step-1 this estimation will depend on the assumptions made on the signal such as:

Stationary and centered case: empirical estimator used in the reference [3].

Cyclostationary and centered case: estimator implemented in the reference [10].

Cyclostationary and non-centered case: estimator implemented in the reference [11].

Identification

Step-8: The computation of the matrices $T_1 Q_x(\tau_1^k, \tau_2^k, \tau_3^k) T_1^H$ and the estimation of the unitary matrix $U_1$ (associated with the cyclical parameters $(\alpha, \tau_1, \tau_2, \tau_3, \epsilon)$) in carrying out the joint SVD of the K matrices: $T_1 Q_x(\tau_1^k, \tau_2^k, \tau_3^k) T_1^H$.

Step-9: The computation of the matrices $T_2 Q_x(\tau_1^k, \tau_2^k, \tau_3^k) T_2^H$ and the estimation of the unitary matrix $U_2$ (associated with the other sources) in carrying out the joint SVD of the K matrices: $T_2 Q_x(\alpha^k, \tau_1^k, \tau_2^k, \tau_3^k) T_2^H$.

Step-10: The computation of the unitary matrix U in performing $U = [U_1 \; U_2]$ Step-11: The computation of $T^\# U = [b_1 \ldots b_P]$ and the building of the matrices $B_l$ with a dimension (N×N) from the columns $b_l$ of $T^\# U$.

Step-12: The estimation of the signatures $a_q$ ($1 \leq q \leq P$) of the P sources in applying a decomposition into elements on each matrix $B_l$.

Recapitulation of the Second Version of the Cyclical Procedure

The steps of the second version of the cyclical FORBIUM method are summarized here below and are applied to L observations $x(IT_e)$ ($1 \leq l \leq L$) of the signals received on the sensors ($T_e$: sampling period).

Estimation

Step-1: The estimation of the matrices $Q_x$ and $\tilde{Q}_x$ from the L observations $x(IT_e)$. The estimation of these matrices will depend on the following assumptions:
  Stationary and centered case: empirical estimator used in the reference [3].
  Cyclostationary and centered case: estimator implemented in the reference [10].
  Cyclostationary and non-centered case: estimator implemented in the reference [11].

Step-2: The eigen-element decomposition of the matrices $Q_x$ and $\tilde{Q}_x$. From these operations of decomposition, the estimation of the number of sources P and the use of the P main eigenvalues such that: $Q_x \approx E_x \Lambda_x E_x^H$ and $\tilde{Q}_x = \tilde{E}_x \tilde{\Lambda}_x \tilde{E}_x^H$ where $\Lambda_x$ and $\tilde{\Lambda}_x$ are diagonal matrices containing the P eigen values with the highest modulus and $E_x$ and $\tilde{E}_x$ are the matrices containing the P associated eigen vectors.

Step-3: The building of the whitening matrices: $T=(\Lambda_x)^{-1/2} E_x^H$ and $\tilde{T}=(\tilde{\Lambda}_x)^{-1/2} \tilde{E}_x^H$ Step-4: The selection of the cyclical parameters ($\alpha,\tau_1,\tau_2,\tau_3, \epsilon$) and the estimation of the matrix $Q_x^\epsilon(\alpha,\tau_1,\tau_2,\tau_3)$ from the L observations $x(IT_e)$. The estimation of this matrix will depend on the following assumptions on the signals:
  Stationary and centered case: empirical estimator used in the reference [3].
  Cyclostationary and centered case: estimator implemented in the reference [10].
  Cyclostationary and non-centered case: estimator implemented in the reference [11].

Step-5: The computation of a matrix $W_x^\epsilon(\alpha,\tau_1,\tau_2,\tau_3)$ of (30) from matrices $Q_x^\epsilon(\alpha,\tau_1,\tau_2,\tau_3)$, T and $\tilde{T}$. After singular value decomposition of $W_x^\epsilon(\alpha,\tau_1,\tau_2,\tau_3)$, the determining of the unitary matrices $T_1$ and $\tilde{T}_1$ associated with the non-zero singular values and $T_2$ and $\tilde{T}_2$ associated with the zero singular values.

Step-6: The selection of the K triplets $(\alpha^k,\tau_1^k,\tau_2^k,\tau_3^k,\epsilon^k)$.

Step-7: The estimation of the K matrices $Q_x^{\epsilon k}(\alpha^k,\tau_1^k,\tau_2^k,\tau_3^k)$ of (19). As in the step-1 this estimation will depend on the assumptions made on the signal such as:
  Stationary and centered case: empirical estimator used in the reference [3].
  Cyclostationary and centered case: estimator implemented in the reference [10].
  Cyclostationary and non-centered case: estimator implemented in the reference [11].

Step-8: The computation of the matrices $T_1 Q_x^{\epsilon k}(\alpha^k,\tau_1^k,\tau_2^k,\tau_3^k) T_1^H$ and the estimation of the unitary matrix $U_1$ or $\tilde{U}_1$ (associated with the cyclical parameters ($\alpha,\tau_1,\tau_2,\tau_3,\epsilon$)) in carrying out the joint SVD of the K matrices: $T_1 Q_x^{\epsilon k}(\alpha^k, \tau_1^k,\tau_2^k,\tau_3^k) T_1^H$.

Step-9: The computation of the matrices $T_2 Q_x^{\epsilon k}(\alpha^k,\tau_1^k,\tau_2^k,\tau_3^k) T_2^H$ and the estimation of the unitary matrix $U_2$ or $\tilde{U}_2$ (associated with the cyclical parameters ($\alpha,\tau_1,\tau_2,\tau_3,\epsilon$)) in carrying out the joint SVD of the K matrices: $T_2 Q_x^{\epsilon k}(\alpha^k, \tau_1^k,\tau_2^k,\tau_3^k) T_2^H$.

Step-10: The computation of the unitary matrix U in performing $U=[U_1 \ U_2]$

Step-11: The computation of $T^\# U=[b_1 \ldots b_P]$ and the building of the matrices $B_l$ with a dimension (N×N) from the columns $b_l$ of $T^\# U$.

Step-12: The estimation of the signatures $a_q$ ($1 \leq q \leq P$) of the P sources in applying a decomposition into elements on each matrix $B_l$.

BIBLIOGRAPHY

[1] A. Belouchrani, K. Abed-Meraim, J. F. Cardoso, E. Moulines, "A blind source separation technique using second-order statistics", *IEEE Trans. Sig. Proc.,* Vol.45, N°2, pp. 434-444, February 1997.

[2] J F. Cardoso, "Super-symmetric decomposition of the fourth order cumulant tensor", *ICASSP* 1991.

[3] J. F. Cardoso, A. Souloumiac, "Blind beamforming for non-gaussian signals", *IEE Proceedings-F,* Vol.140, N°6, pp. 362-370, December 1993.

[4] P. Chevalier, G. Benoit, A. Ferréol <<Direction finding after blind identification of sources steering vectors: The blind-maxcor and blind-MUSIC methods>>, EUSIPCO, Trieste, pp 2097-2100, 1996

[5] P. Chevalier, "Optimal separation of independent narrow-band sources: concept and performance", *Sig. Proc.,* Elsevier, Vol.73, pp 27-47, 1999.

[6] P. Chevalier, A. Ferréol, "On the virtual array concept for the fourth-order direction finding problem", *IEEE trans on signal processing,* Vol.47, N°9, pp. 2592-2595, September 1999.

[7] P.Comon, "Independent component analysis—a new concept ?", *Sig. Proc.,* Elsevier, Vol.36, N°3, April 1994.

[8] P. Comon, "Blind channel identification and extraction of more sources than sensors", *SPIE Conf Adv Proc VIII, San Diego,* July 1998.

[9] L. De Lathauwer, B. De Moor, J. Vandewalle, "ICA techniques for more sources than sensors", Proc. *IEEE Processing Workshop on Higher Order Statistics,* Caesarea, Israel, June 1999.

[10] A. Ferréol, P. Chevalier, "On the behavior of current second and higher order blind source separation methods for cyclostationary sources", *IEEE Trans. Sig. Proc.,* Vol.48, N°6, pp. 1712-1725, June 2000.

[11] A. Ferréol, P. Chevalier, L. Albera "Higher order blind separation of non zero-mean cyclostationary sources", (*EUSPICO* 2002), Toulouse, September 2002.

[12] A. Ferréol, P. Chevalier, L. Albera, "Procédé de traitement d'antennes sur des signaux cyclostationnaires potentiellement non centrés," (Method of antenna processing on potentially non-centered cyclostationary signals), patent, May 2002.

[13] A. Ferréol, P. Chevalier, "Higher order blind source separation using the cyclostationary property of the signals", ICASSP Munich, Vol. 5, pp4061-4064, 1997

[14] A. Ferréol, P. Chevalier, "Higher order blind source separation using the cyclostationary property of the signals", ICASSP Munich, Vol. 5, pp4061-4064, 1997

[10] A. Taleb "An algorithm for the blind identification of N independent signal with 2 sensors", $16^{th}$ *symposium on signal processing and its applications (ISSPA* 2001), Kuala-Lumpur, August 2001.

What is claimed is:

1. A method of fourth-order, blind identification of two sources in a system including a number of sources P and a number N of reception sensors receiving observations, the sources having different tri-spectra, comprising the following steps:
  a) fourth-order whitening of the observations received on the reception sensors in order to orthonormalize the direction vectors of the sources in matrices of quadricovariance of the observations used,
  b) joint diagonalizing of several whitened matrices of quadricovariance to identify the spatial signatures of the sources.

2. The method according to claim 1, wherein the observations used correspond to time-domain averaged matrices of quadricovariance defined by:

$$Q_x(\tau_1, \tau_2, \tau_3) = \sum_{p=1}^{P} c_p(\tau_1, \tau_2, \tau_3)(a_p \otimes a_p^*)(a_p \otimes a_p^*)^H \quad (4a)$$

$$= A_Q C_s(\tau_1, \tau_2, \tau_3) A_Q^H \quad (4b)$$

where $A_Q$ is a matrix with a dimension ($N^2 \times P$) defined by $A_Q = [(a_1 a_1^*), \ldots, (a_P a_P^*)]$, $C_s(\tau_1,\tau_2,\tau_3)$ is a diagonal matrix with a dimension (P×P) defined by $C_s(\tau_1,\tau_2,\tau_3) =$ diag$[c_1(\tau_1,\tau_2,\tau_3), \ldots, c_P(\tau_1,\tau_2,\tau_3)]$ and $c_p(\tau_1,\tau_2,\tau_3)$ is defined by:

$$c_p(\tau_1,\tau_2,\tau_3) = <\text{Cum}(s_p(t), s_p(t-\tau_1)^*, s_p(t-\tau_2)^*, s_p(t-\tau_3))>. \quad (5)$$

3. The method according to claim 2, comprising the following steps:
  Step 1: estimating, through $\hat{Q}_x$, of the matrix $Q_x$, from the L observations $x(lT_e)$ using a non-skewed and asymptotically consistent estimator
  Step 2: eigen-element decomposition of $\hat{Q}_x$, the estimation of the number of sources P and the limiting of the eigen-element decomposition to the P main components:
  $\hat{Q}_x \approx \hat{E}_x \hat{\Lambda}_x \hat{E}_x^H$, where $\hat{\Lambda}_x$ is the diagonal matrix containing the P eigenvalues with the highest modulus and $\hat{E}_x$ is the matrix containing the associated eigenvectors
  Step 3: building of the whitening matrix: $\hat{T} = (\hat{\Lambda}_x)^{-1/2} \hat{E}_x^H$
  Step 4: selecting K triplets of delays $(\tau_1^k, \tau_2^k, \tau_3^k)$, where $|\tau_1^k| + |\tau_2^k| + |\tau_3^k| \neq 0$
  Step 5: estimating, through $\hat{Q}_x(\tau_1^k, \tau_2^k, \tau_3^k)$, of K matrices $Q_x(\tau_1^k, \tau_2^k, \tau_3^k)$
  Step 6: computing of the matrices $\hat{T} \hat{Q}_x(\tau_1^k, \tau_2^k, \tau_3^k) \hat{T}^H$ and the estimation, by $\hat{U}_{sol}$, of the unitary matrix $U_{sol}$ by the joint diagonalizing of the K matrices $\hat{T} \hat{Q}_x(\tau_1^k, \tau_2^k, \tau_3^k) \hat{T}^H$
  Step 7: computing $\hat{T}^{\#} \hat{U}_{sol} = [\hat{b}_1 \ldots \hat{b}_P]$ and the building of the matrices $\hat{B}_l$ sized (N×N)
  Step 8: estimating, through $\hat{a}_p$, of the signatures $a_q$ ($1 \leq q \leq P$) of the P sources in applying a decomposition into elements on each matrix $\hat{B}_l$.

4. The method according to claim 1, comprising evaluating quality of identification of the associated direction vector in using a criterion:

$$D(A, \hat{A}) = (\alpha_1, \alpha_2, \ldots, \alpha_P) \quad (16)$$

where $$\alpha_p = \min_{1 \leq i \leq P} [d(a_p, \hat{a}_i)] \quad (17)$$

and where d(u,v) is the pseudo-distance between the vectors u and v, such that:

$$d(u, v) = 1 - \frac{|u^H v|^2}{(u^H u)(v^H v)}. \quad (18)$$

5. The method according to claim 1, a fourth-order cyclical after the step a) of fourth-order whitening.

6. The method according to claim 5, wherein the identification step is performed in using fourth-order statistics.

7. The method according to claim 1 wherein the number of sources P is greater than or equal to the number of sensors.

8. The method according to claim 1, comprising goniometry using the identified signature of the sources.

9. The method according to claim 1, comprising spatial filtering after the identified signature of the sources.

10. The use of the method according to claim 1, for use in a communications network.

11. The method according to claim 2, comprising evaluating quality of identification of the associated direction vector in using a criterion $$D(A, \hat{A}) = (\alpha_1, \alpha_2, \ldots, \alpha_P)$$

where $$\alpha_p = \min_{1 \leq i \leq P} [d(a_p, \hat{a}_i)]$$

and where d(u,v) is the pseudo-distance between the vectors u and v, such that:

$$d(u, v) = 1 - \frac{|u^H v|^2}{(u^H u)(v^H v)}.$$

12. The method according to claim 3, comprising evaluating quality of identification of the associated direction vector in using a criterion $$D(A, \hat{A}) = (\alpha_1, \alpha_2, \ldots, \alpha_P)$$

where $$\alpha_p = \min_{1 \leq i \leq P} [d(a_p, \hat{a}_i)]$$

and where d(u,v) is the pseudo-distance between the vectors u and v, such that:

$$d(u, v) = 1 - \frac{|u^H v|^2}{(u^H u)(v^H v)}.$$

13. The method according to claim 2, a fourth-order cyclical after the step a) of fourth-order whitening.

14. The method according to claim 2, wherein the identification step is performed in using fourth-order statistics.

15. The method according to claim 2, wherein the number of sources P is greater than or equal to the number of sensors.

16. The method according to claim 2, comprising goniometry using the identified signature of the sources.

17. The method according to claim 3, a fourth-order cyclical after the step a) of fourth-order whitening.

18. The method according to claim 3, wherein the identification step is performed in using fourth-order statistics.

19. The method according to claim 3, wherein the number of sources P is greater than or equal to the number of sensors.

20. The method according to claim 3, comprising goniometry using the identified signature of the sources.

* * * * *